(12) United States Patent
Lindsay (10) Patent No.: US 7,482,630 B2
(45) Date of Patent: Jan. 27, 2009

(54) NAND MEMORY ARRAYS

(75) Inventor: Roger W Lindsay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 11/209,301

(22) Filed: Aug. 23, 2005

(65) Prior Publication Data

US 2005/0281092 A1   Dec. 22, 2005

Related U.S. Application Data

(62) Division of application No. 10/692,430, filed on Oct. 23, 2003, now Pat. No. 7,419,895.

(51) Int. Cl.
*H01L 27/10* (2006.01)
*H01L 29/76* (2006.01)
*H01L 29/94* (2006.01)
*H01L 31/062* (2006.01)
*H01L 31/113* (2006.01)

(52) U.S. Cl. .................. 257/71; 257/202; 257/390; 257/391

(58) Field of Classification Search ............... 257/71, 257/202, 390, 391, 369, 212, 298
See application file for complete search history.

(56) References Cited

U.S. PATENT DOCUMENTS

| | | | |
|---|---|---|---|
| 6,115,287 A * | 9/2000 | Shimizu et al. | 365/185.17 |
| 6,411,548 B1 | 6/2002 | Sakui | |
| 2002/0149081 A1 | 10/2002 | Goda | |
| 2006/0091447 A1 * | 5/2006 | Ema | 257/314 |

\* cited by examiner

*Primary Examiner*—Chuong A. Luu
(74) *Attorney, Agent, or Firm*—Leffert Jay & Polglaze, P.A.

(57) ABSTRACT

A NAND memory array has a substrate, a source select gate formed on the substrate, and a drain select gate formed on the substrate. A string of floating-gate memory cells is formed on the substrate and is connected in series between the source select gate and the drain select gate. A drain contact has a head connected substantially perpendicularly to a stem. The head is aligned with the drain select gate and overlies a dielectric layer formed on the drain select gate. The stem overlies a polysilicon plug formed on the substrate. A bit line contact is in direct electrical contact with the head.

30 Claims, 7 Drawing Sheets

NAND MEMORY ARRAYS

CROSS REFERENCE TO RELATED APPLICATION

This is a divisional application of application Ser. No. 10/692,430, titled "NAND MEMORY ARRAYS," filed Oct. 23, 2003 now U.S. Pat. No. 7,419,895, which application is assigned to the assignee of the present invention and the entire contents of which are incorporated herein by reference.

TECHNICAL FIELD OF THE INVENTION

The present invention relates generally to memory devices and in particular the present invention relates to NAND memory arrays.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word-select line, and the drain region of each memory cell of a column of the array is connected to a bit line. The memory array for NOR flash memory devices is accessed by a row decoder activating a row of floating gate memory cells by selecting the word-select line coupled to their gates. The row of selected memory cells then place their data values on the column bit lines by flowing a differing current if in a programmed state or not programmed state from a coupled source line to the coupled column bit lines.

The array of memory cells for NAND flash memory devices is also arranged such that the control gate of each memory cell of a row of the array is connected to a word-select line. However, each memory cell is not directly coupled to a column bit line by its drain region. Instead, the memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

Fabrication of many NAND memory arrays includes forming integrated circuitry using semiconductor-processing methods. Many of these methods include using a mask to form a source slot for containing the source line and using another mask to form a drain contact region for containing a drain contact for connecting a drain of the series-coupled string to the bit line. Using separate masks for the source slot and drain contact results in extra fabrication steps.

For the reasons stated above, and for other reasons stated below which will become apparent to those skilled in the art upon reading and understanding the present specification, there is a need in the art for alternatives for fabricating NAND memory arrays.

SUMMARY

The above-mentioned problems with fabricating NAND memory arrays and other problems are addressed by the present invention and will be understood by reading and studying the following specification.

The various embodiments relate to NAND memory arrays. A source slot and a drain contact region of a NAND memory array are formed using a single mask. This reduces the number of process steps compared to methods that use separate masks to form the source slot and drain contact region.

One embodiment provides a NAND memory array having a substrate, a source select gate formed on the substrate, and a drain select gate formed on the substrate. A string of floating-gate memory cells is formed on the substrate and is connected in series between the source select gate and the drain select gate. A drain contact has a head connected substantially perpendicularly to a stem. The head is aligned with the drain select gate and overlies a dielectric layer formed on the drain select gate. The stem overlies a polysilicon plug formed on the substrate. A bit line contact is in direct electrical contact with the head.

Another embodiment provides a NAND memory device having an array of floating-gate memory cells. The array includes a plurality of rows of memory cells, each row coupled to a word line and a plurality of columns of memory cells grouped in strings, each column coupled to a bit line. The memory cells of each string of memory cells are connected in series between a source select gate and a drain select gate. For at least one string of memory cells, a drain contact has a head connected substantially perpendicularly to a stem. The head is aligned with a drain select gate and overlies a dielectric layer formed on that drain select gate. The stem overlies a polysilicon plug formed on a substrate of the memory device adjacent the drain select gate. A bit line contact is coupled to the bit line and is in direct electrical contact with the head.

Further embodiments of the invention include apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1A:
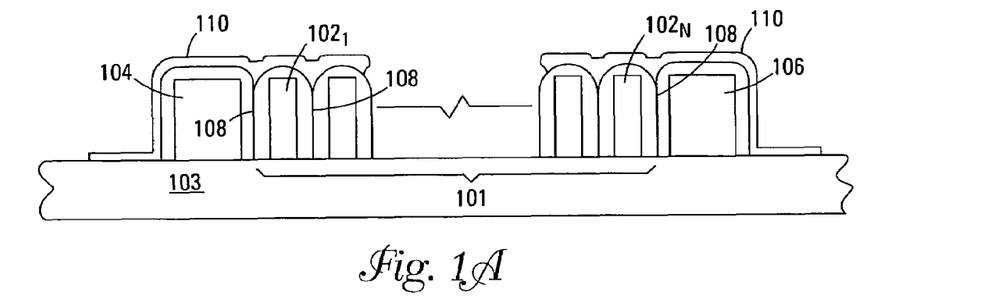
FIGS. 1A-1H are cross-sectional views of a portion of a memory array during various stages of fabrication according to an embodiment of the invention.

FIGS. 1A-1H generally depict a method of forming a portion of a memory array of a NAND flash memory device in accordance with an embodiment of the invention. FIG. 1A depicts a portion of the memory array after several processing steps have occurred. Formation of the structure depicted in FIG. 1A is well known and will not be detailed herein. In general, FIG. 1A depicts a string of memory cells $102_1$ to $102_N$ connected in series to form a NAND string 101 on a substrate 103, e.g., floating-gate transistors connected source to drain in series. A source select gate 104, such as a field effect transistor (FET), is disposed on substrate 103 at one end of the NAND string 101. A drain of source select gate 104 is connected to a source of memory cell $102_1$. A drain select gate 106, such as a field effect transistor (FET), is disposed on substrate 103 at the other end of the NAND string 101. A source of drain select gate 106 is connected to a drain of memory cell $102_N$. Dielectric spacers 108, e.g., of TEOS (tetraethylorthosilicate), separate successive memory cells 102 from each other, as shown in FIG. 1A. A dielectric spacer 108 also separates source select gate 104 from memory cell $102_1$ and drain select gate 106 from memory cell $102_N$, also shown in FIG. 1A.

The method commences by depositing a dielectric layer 110, such as nitride layer, e.g., silicon nitride ($Si_3N_4$), on substrate 103 and on source select gate 104, memory cells 102 of NAND string 101, and drain select gate 106, as shown in FIG. 1A, using a suitable deposition technique, such as chemical vapor deposition (CVD) etc.

Figure 1B:
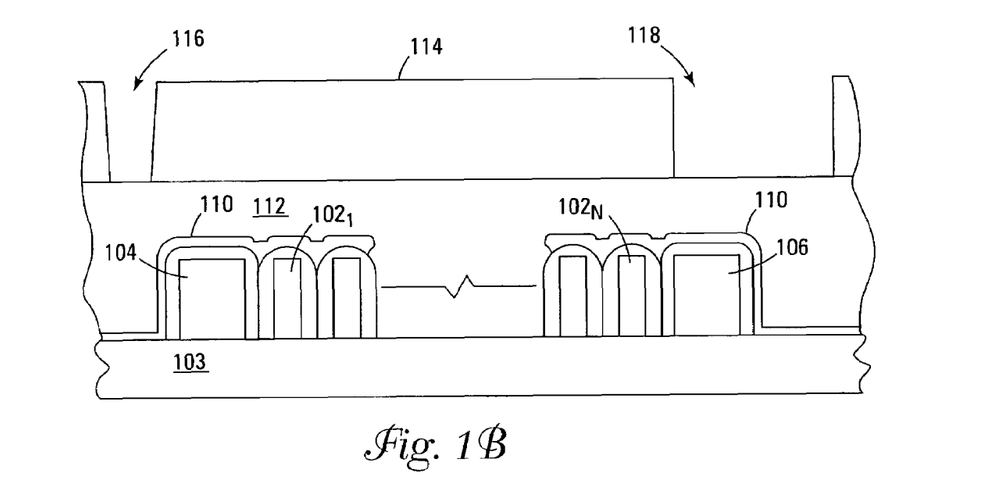

A bulk insulation layer (or another dielectric layer) 112 is formed on dielectric layer 110 followed by removal of excess portions of insulation layer 112, e.g., by chemical mechanical planerization (CMP), in FIG. 1B. For one embodiment, the insulation layer 112 contains a dielectric material that is selective over the materials of the substrate 103 and the dielectric layer 110. This results in a self-alignment contact process involving removal of the insulation layer 112 where desired. One example for the insulation layer 112 would be a doped silicate glass. Examples of doped silicate glasses include BSG (borosilicate glass), PSG (phosphosilicate glass), and BPSG (borophosphosilicate glass).

In FIG. 1B, a mask layer 114 is also formed on insulation layer 112 to define areas for removal of the insulation layer 112. As one example, the mask layer 114 is a patterned photoresist layer as is commonly used in semiconductor fabrication. Specifically, mask layer 114 is patterned to include regions 116 and 118 for exposing portions of insulation layer 112 for respectively forming a source slot in insulation layer 112 for containing a source line of the memory array and a drain contact region in insulation layer 112 for containing a drain contact of the memory array.

Figure 1C:
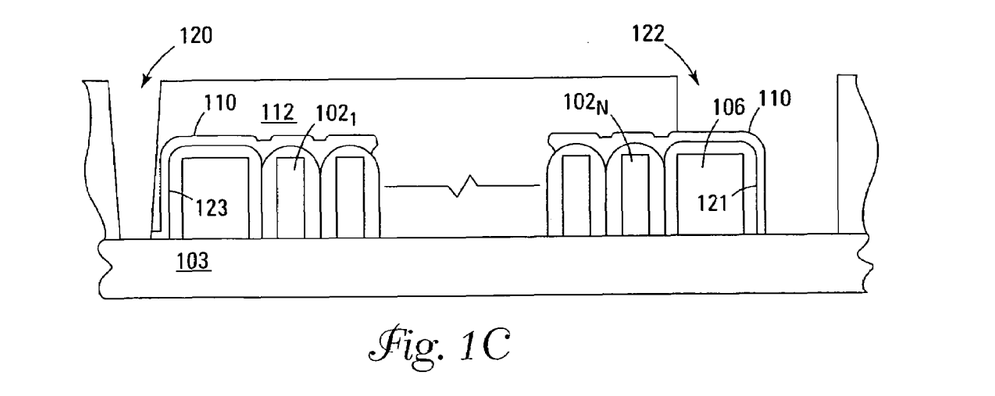

The exposed areas of the insulation layer 112 are then removed in FIG. 1C such as by dry etching, e.g., using carbon trifluoride ($CHF_3$), carbon tetrafluoride ($CF_4$), and/or difluoromethane ($CH_2F_2$) with argon, or other removal process, forming a source slot 120 and a drain contact region 122 in insulation layer 112. The removal process exposes the portion of dielectric layer 110 that overlies drain select gate 106 without removing this portion of dielectric layer 110. This is the self-alignment contact process mentioned above that aligns drain contact region 122 and this portion of dielectric layer 110. Subsequently, mask layer 114 is removed. More specifically, self-alignment of the drain contact region 122 involves aligning the drain contact region 122 to a sidewall 121 of drain select gate 106. For one embodiment, source slot 120 is formed to self-align with the portion of dielectric layer 110 that overlies source select gate 104, thus reducing the distance between source select gate 104 and drain select gate 106. Specifically, this involves aligning source slot 120 to a sidewall 123 of source select gate 104.

Portions of dielectric layer 110 formed on substrate 103 within the source slot 120 and the drain contact region 122 are then removed or punched through to substrate 103, e.g., by etching $CF_4$ and/or $CHF_3$, as shown in FIG. 1C. For some embodiments, the removal of dielectric layer 110 from substrate 103 removes some of dielectric layer 110 from drain select gate 106. For one embodiment, a polymer builds up on the portion of dielectric layer 110 on drain select gate 106 during the removal of insulation layer 112. Such polymer build-up can act to prevent this portion of dielectric layer 110 from being completely removed during the punch-through to substrate 103.

Figure 2:
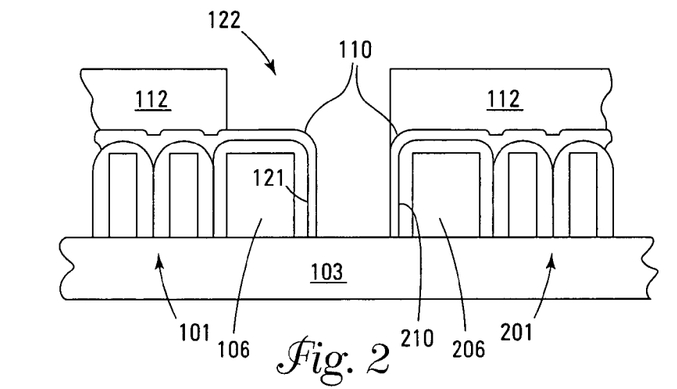
FIG. 2 is a cross-sectional view of a portion of a memory array during a stage of fabrication according to another embodiment of the invention.

FIG. 2 illustrates self alignment of drain contact region 122 to the portion of dielectric layer 110 on drain select gate 106 and to a portion of dielectric layer 110 on a drain select gate 206 connected to a NAND string 201 according to another embodiment of the present invention. That is, drain contact region 122 self aligns to sidewall 121 of drain select gate 106 and a sidewall 210 of drain select gate 206. The fact that drain contact region 122 self aligns to sidewalls 121 and 210 makes the alignment of drain contact region 122 less critical.

Note that a single mask layer 114 is used to form both source slot 120 and drain contact region 122 and thus the source slot 120 and the drain contact region 122 are formed substantially simultaneously. This reduces the number of process steps compared to methods that use separate masks to form the source slot and drain contact region.

Figure 1D:
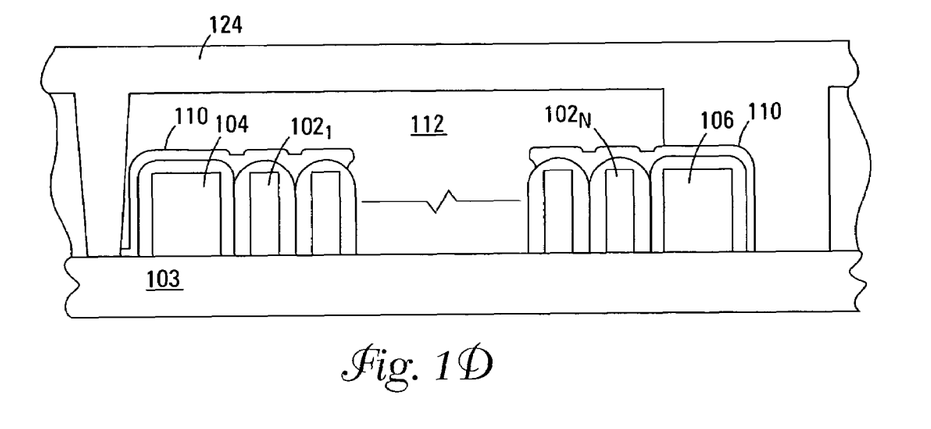
Figure 1E:
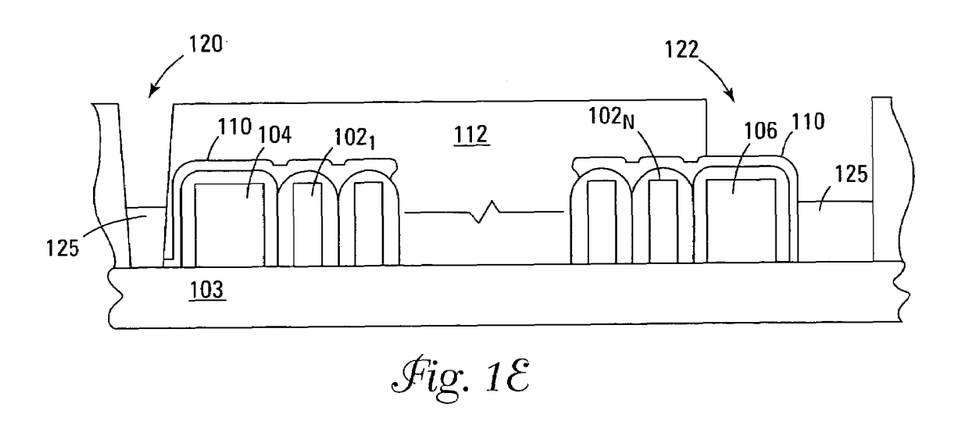

For one embodiment, a polysilicon layer 124 is formed over the structure of FIG. 1C, as shown in FIG. 1D. Subsequently, a portion of the polysilicon layer 124 is removed, leaving polysilicon plugs 125 in source slot 120 in contact with substrate 103, as shown in FIG. 1E. For another embodiment, etching the polysilicon layer 124 back and recessing it into source slot 120 and drain contact region 122 forms the polysilicon plugs 125.

Figure 1F:
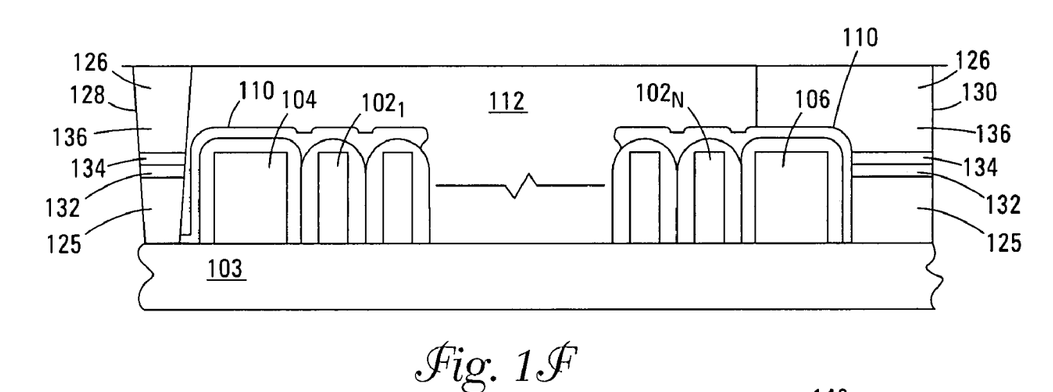

In FIG. 1F, an electrically conducting plug 126 is formed in source slot 120 to form a source line 128 and in drain contact region 122 to form a drain contact 130 substantially concurrently. This can be accomplished using standard metallization procedures. For example, for one embodiment, conducting plugs 126 are formed by depositing a barrier layer 132, such as titanium nitride (TiN) on the polysilicon plugs 125, e.g., using CVD, followed by depositing a first metal layer 134, such as titanium (Ti), on barrier layer 132, e.g., using CVD, followed by depositing a second metal layer 136, such as tungsten (W), on the first metal layer 134, e.g., using CVD, followed by CMP of the second metal layer 136.

Figure 1G:
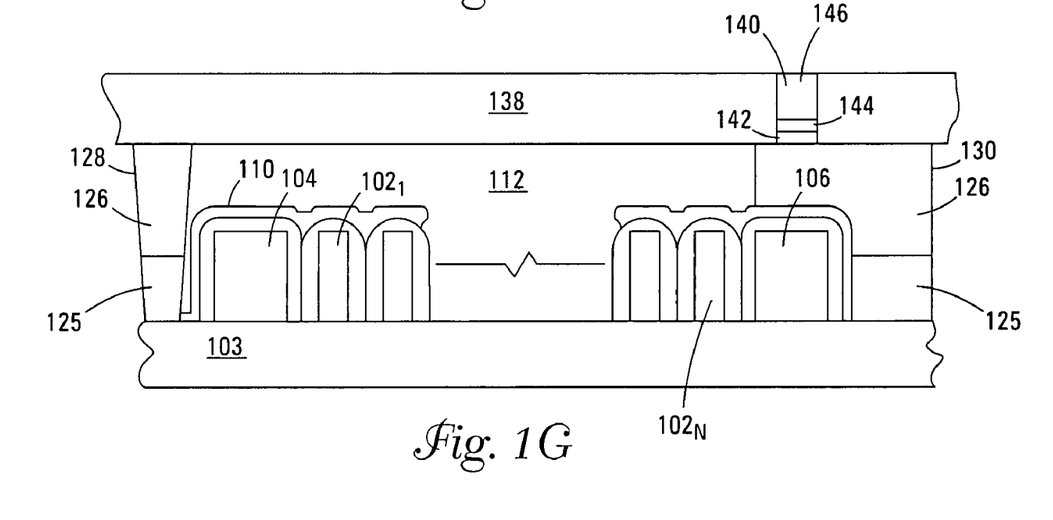

In FIG. 1G, an interlayer dielectric (ILD) 138 is deposited on the structure of FIG. 1E. A bit line contact plug 140 is then formed through ILD 138 in direct contact with drain contact 130. This is in contrast with many conventional methods for forming NAND memory arrays, where the bit line contact is formed in direct contact with the substrate. Moreover, bit line contact plug 140 is aligned with the drain select gate 106, whereas in many conventional NAND memory arrays, where the bit line contact is formed in direct contact with the substrate, the bit line contact is located at the side of the drain select gate, e.g., to the right of the drain select 106 in FIG. 1G.

The ILD 138 is a dielectric material such as silicon oxides, silicon nitrides, or silicon oxynitrides. For one embodiment, formation of bit line contact plug 140 includes patterning, followed by etching through ILD 138, followed by depositing a barrier layer 142, such as TiN, in contact with drain contact 130, e.g., using CVD, followed by depositing a first metal layer 144, such as Ti, on the barrier layer 142, e.g., using CVD, followed by depositing a second metal layer 146, such as tungsten, on the first metal layer 144, e.g., using CVD, followed by CMP of the second metal layer, as shown in FIG. 1G.

Figure 1H:
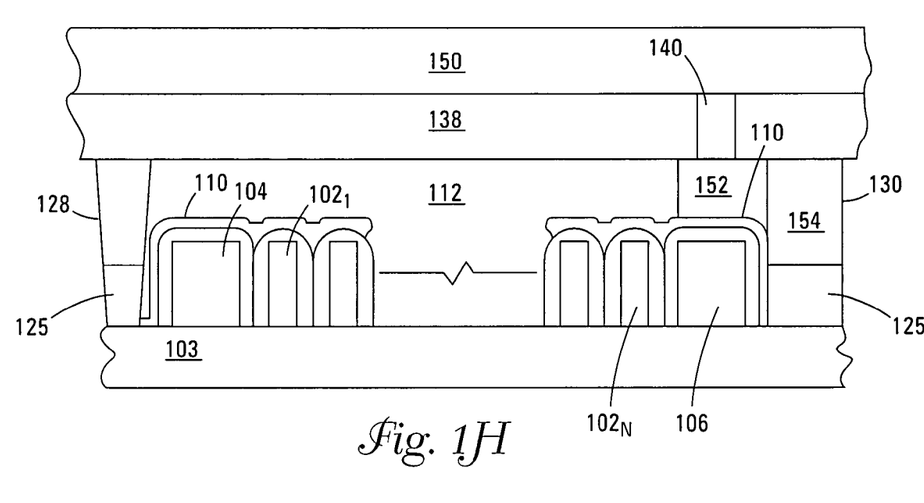

Subsequently, a metal layer 150, such as aluminum, is deposited on ILD layer 138 in FIG. 1H in electrical contact with bit line contact plug 140, e.g., using CVD. Metal layer 150 is patterned, etched, and processed, e.g., using standard processing, to produce individual bit lines therefrom.

Figure 3:
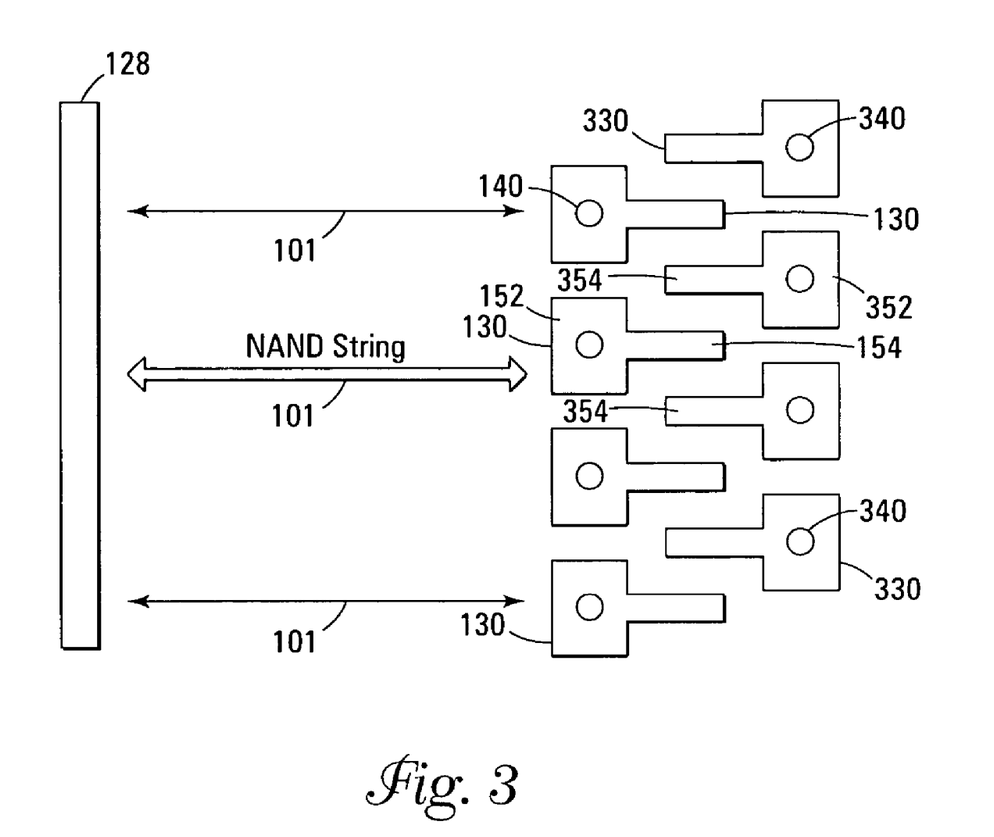
FIG. 3 is a top view of a portion of a memory array according to another embodiment of the invention.

FIG. 3 a top view of a memory array of a NAND flash memory device illustrating source line 128 and a plurality of drain contacts 130 respectively electrically connected to a plurality of bit line contact plugs 140 according to another embodiment of the present invention. A plurality of NAND strings 101 is disposed between source line 128 and drain contacts 130. FIG. 3 shows that for one embodiment, drain contact 130 has a substantially T-shaped cross section when viewed from the top and has a head 152 connected substantially perpendicularly to a stem 154 of drain contact 130. Bit line contact plug 140 is formed in direct contact with head 152. Head 152 provides more surface area for forming bit line contact plug 140 to facilitate easier alignment of plug 140. For one embodiment, head 152 overlies the dielectric layer 110 on drain select gate 106 and is aligned with the drain select gate 106, and stem 154 overlies the polysilicon plug 125, as shown in FIG. 1H.

A plurality of drain contacts 330 is respectively electrically connected to a plurality of bit line contact plugs 340, as shown in FIG. 3. Drain contacts 330 and bit line contact plugs 340 are as described above for drain contacts 130 and bit line contact plugs 140, respectively. Each drain contact 330 has a T-shaped cross section when viewed from the top and has a head 352 connected substantially perpendicularly to a stem 354 of drain contact 330, where bit line contact plug 340 is formed in direct contact with head 352. Drain contacts 130 and 330 are staggered relative to each other so that a stem 154 of a drain contact 130 is located between stems 354 of successive drain contacts 330. Each of a plurality of NAND strings (not shown) is disposed between a source line (not shown) and drain contacts 330, as is described above and shown in FIG. 3 for NAND strings 101 source line 128, and drain contacts 130.

Figure 4:
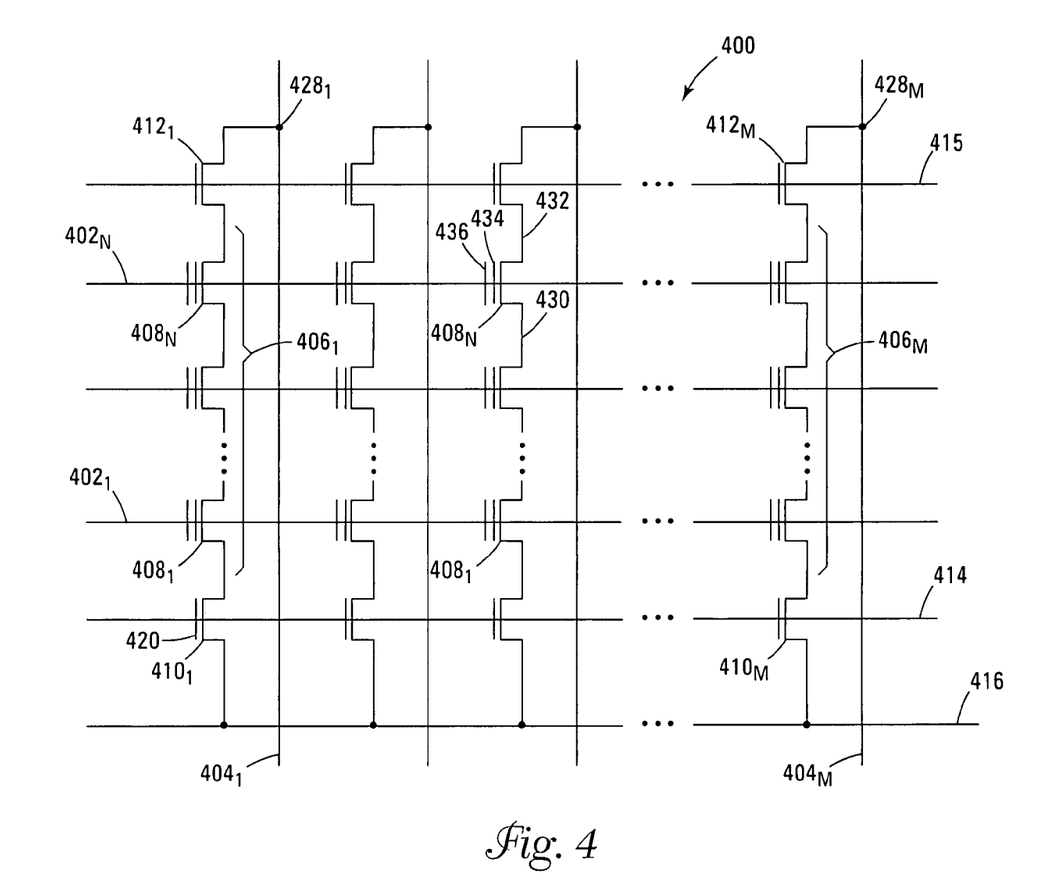
FIG. 4 is a schematic of a memory array according to another embodiment of the invention.

FIG. 4 illustrates a NAND memory array 400 according to another embodiment of the present invention and formed according to methods of the present invention. As shown in FIG. 4, the memory array 400 includes word lines $402_1$ to $402_N$ and intersecting local bit lines $404_1$ to $404_M$. For ease of addressing in the digital environment, the number of word lines 402 and the number of bit lines 404 are each some power of two, e.g., 256 word lines 402 by 4,096 bit lines 404. The local bit lines 404 are coupled to global bit lines (not shown in FIG. 4) in a many-to-one relationship.

Memory array 400 includes NAND strings $406_1$ to $406_M$. Each NAND string includes floating gate transistors $408_1$ to $408_N$, each located at an intersection of a word line 402 and a local bit line 404. The floating gate transistors 408 represent non-volatile memory cells for storage of data. The floating gate transistors 408 of each NAND string 406 are connected in series source to drain between a source select gate 410, e.g., an FET, and a drain select gate 412, e.g., an FET. Each source select gate 410 is located at an intersection of a local bit line 404 and a source select line 414, while each drain select gate 412 is located at an intersection of a local bit line 404 and a drain select line 415.

A source of each source select gate 410 is connected to a common source line 416. The drain of each source select gate 410 is connected to the source of the first floating gate transistor 408 of the corresponding NAND string 406. For example, the drain of source select gate $410_1$ is connected to the source of floating gate transistor $408_1$ of the corresponding NAND string $406_1$. A control gate 420 of each source select gate 410 is connected to source select line 414.

The drain of each drain select gate 412 is connected to the local bit line 404 for the corresponding NAND string at a drain contact 428. For example, the drain of drain select gate $412_1$ is connected to the local bit line $404_1$ for the corresponding NAND string $406_1$ at drain contact $428_1$. The source of each drain select gate 412 is connected to the drain of the last floating gate transistor $408_N$ of the corresponding NAND string 406. For example, the source of drain select gate $412_1$ is connected to the drain of floating gate transistor $408_N$ of the corresponding NAND string $406_1$. It is common for two NAND strings to share the same drain contact.

Typical construction of floating gate transistors 408 includes a source 430 and a drain 432, a floating gate 434, and a control gate 436, as shown in FIG. 4. Floating gate transistors 408 have their control gates 436 coupled to a word line 402. A column of the floating gate transistors 408 is a NAND string 406 coupled to a given local bit line 404. A row of the floating gate transistors 408 are those transistors commonly coupled to a given word line 402.

Figure 5:
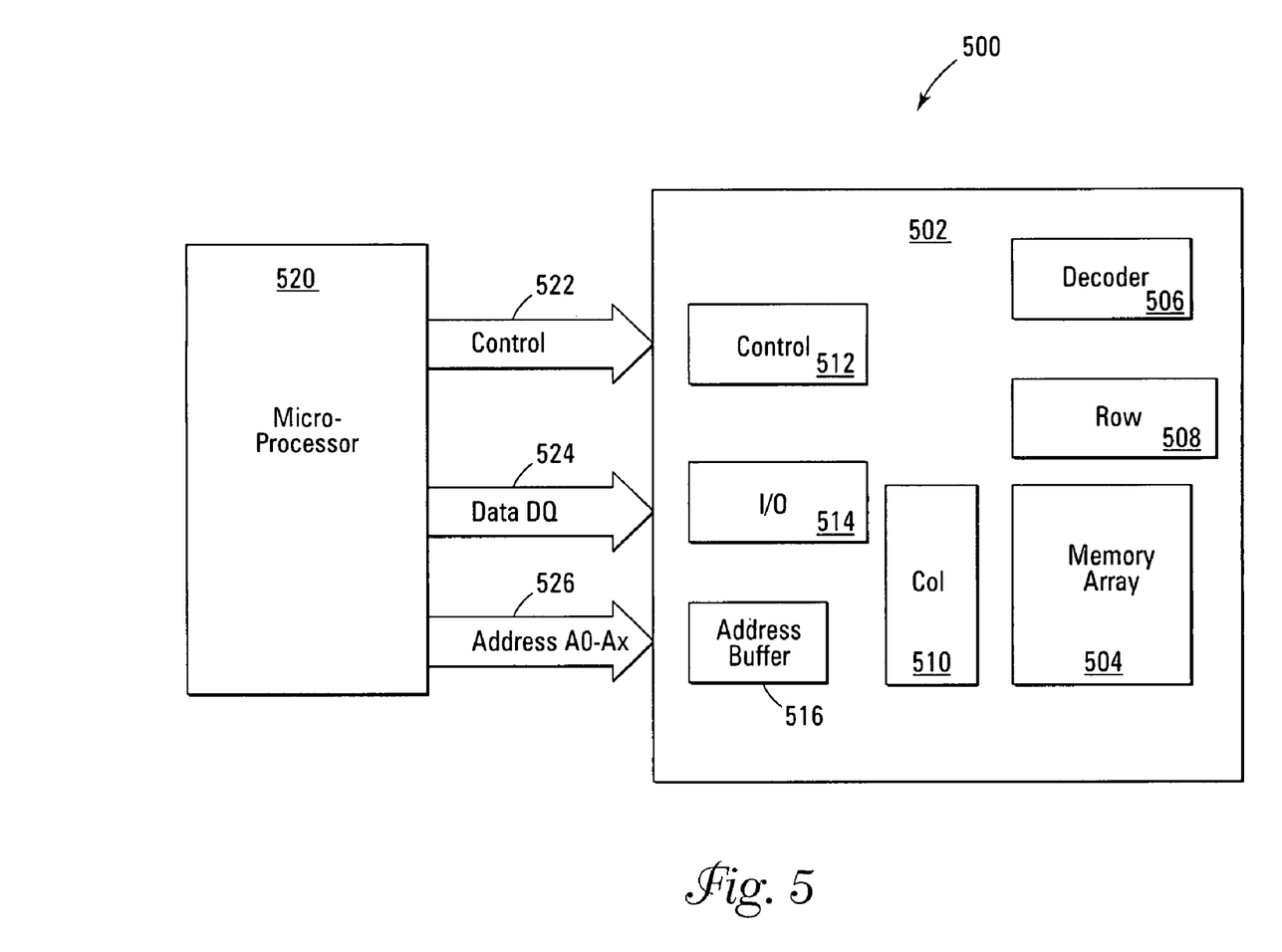
FIG. 5 is a block diagram of a flash memory system according to another embodiment of the invention.

FIG. 5 is a simplified block diagram of a memory system 500 according to another embodiment an embodiment of the invention. Memory system 500 includes an integrated circuit NAND flash memory device 502 that includes an array of flash memory cells 504, an address decoder 506, row access circuitry 508, column access circuitry 510, control circuitry 512, Input/Output (I/O) circuitry 514, and an address buffer 516. Memory system 500 includes an external microprocessor 520, or memory controller, electrically connected to memory device 502 for memory accessing as part of an electronic system. The memory device 502 receives control signals from the processor 520 over a control link 522. The memory cells are used to store data that are accessed via a data (DQ) link 524. Address signals are received via an address link 526 that are decoded at address decoder 506 to access the memory array 504. Address buffer circuit 516 latches the address signals. The memory cells are accessed in response to the control signals and the address signals. It will be appreciated by those skilled in the art that additional circuitry and control signals can be provided, and that the memory device of FIG. 5 has been simplified to help focus on the invention. The array of memory cells 504 is formed in accordance with the present invention.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A NAND memory array comprising:
   a substrate;
   a source select gate formed on the substrate;
   a drain select gate formed on the substrate;
   a string of floating-gate memory cells formed on the substrate and connected in series between the source select gate and the drain select gate;
   a drain contact comprising a head connected substantially perpendicularly to a stem, the head aligned with the drain select gate and overlying a dielectric layer formed on the drain select gate, the stem overlying a polysilicon plug formed on the substrate;
   a bit line overlying the drain contact; and
   a bit line contact coupled to the bit line and in direct electrical contact with the head, the bit line contact overlying the head and interposed between the head and the bit line.

2. The NAND memory array of claim 1, wherein the bit line contact is aligned with the drain select gate.

3. The NAND memory array of claim 1, wherein the bit line contact comprises a barrier layer disposed on the drain contact, a first metal layer disposed on the barrier layer, and a second metal layer disposed on the first metal layer.

4. The NAND memory array of claim 3, wherein the barrier layer, first metal layer, and second metal layer are respectively of titanium nitride, titanium, and tungsten.

5. The NAND memory array of claim 1, wherein the drain contact further comprises a barrier layer disposed on the polysilicon plug, a first metal layer disposed on the barrier layer, and a second metal layer disposed on the first metal layer.

6. The NAND memory array of claim 5, wherein the barrier layer, first metal layer, and second metal layer are respectively of titanium nitride, titanium, and tungsten.

7. The NAND memory array of claim 1, wherein
   a source of the source select gate is coupled to a source line of the NAND memory array and a drain of the source select gate is coupled to a drain of a first floating-gate memory cell of the string of floating-gate memory cells;
   a drain of the drain select gate is coupled to a bit line of the NAND memory array and a source of the drain select gate is coupled to a drain of a last floating-gate memory cell of the string of floating-gate memory cells; and
   a control gate of each floating-gate memory cell is coupled to a word line of the NAND memory array.

8. A NAND memory device comprising:
   an array of floating-gate memory cells, wherein the array comprises:
      a plurality of rows of memory cells, each row coupled to a word line;
      a plurality of columns of memory cells grouped in strings, each column coupled to a bit line, the memory cells of each string of memory cells connected in series between a source select gate and a drain select gate;
      for at least one string of memory cells, a drain contact comprising a head connected substantially perpendicularly to a stem, the head aligned with a drain select gate and overlying a dielectric layer formed on that drain select gate, the stem overlying a polysilicon plug formed on a substrate of the memory device adjacent the drain select gate; and
      a bit line contact coupled to the bit line and in direct electrical contact with the head, the bit line contact overlying the head and interposed between the head and the bit line.

9. The NAND memory device of claim 8, wherein the head of at least one drain contact is aligned with the drain select gate of its respective string of memory cells.

10. The NAND memory device of claim 8, wherein the head of at least one drain contact is aligned with the drain select gate of an adjacent string of memory cells.

11. An electronic system comprising:
    a processor;
    a NAND memory device coupled to the processor, the memory device comprising:
       a substrate;
       a source select gate formed on the substrate;
       a drain select gate formed on the substrate;
       a string of floating-gate memory cells formed on the substrate and connected in series between the source select gate and the drain select gate;
       a drain contact comprising a head connected substantially perpendicularly to a stem, the head aligned with the drain select gate and overlying a dielectric layer formed on the drain select gate, the stem overlying a polysilicon plug formed on the substrate; and
       a bit line contact in direct electrical contact with the head and aligned with the drain select gate.

12. The electronic system of claim 11, wherein
    a source of the source select gate is coupled to a source line of the NAND memory device and a drain of the source select gate is coupled to a drain of a first floating-gate memory cell of the string of floating-gate memory cells;
    a drain of the drain select gate is coupled to a bit line of the NAND memory device and a source of the drain select gate is coupled to a drain of a last floating-gate memory cell of the string of floating-gate memory cells; and a control gate of each floating-gate memory cell is coupled to a word line of the NAND memory device.

13. The electronic system of claim 11, wherein the bit line contact comprises a barrier layer disposed on the drain contact, a first metal layer disposed on the barrier layer, and a second metal layer disposed on the first metal layer.

14. The N electronic system of claim 13, wherein the barrier layer, first metal layer, and second metal layer are respectively of titanium nitride, titanium, and tungsten.

15. The electronic system of claim 11, wherein the drain contact further comprises a barrier layer disposed on the polysilicon plug, a first metal layer disposed on the barrier layer, and a second metal layer disposed on the first metal layer.

16. The electronic system of claim 15, wherein the barrier layer, first metal layer, and second metal layer are respectively of titanium nitride, titanium, and tungsten.

17. An electronic system comprising:
a processor;
a NAND memory device coupled to the processor, the memory device comprising:
  an array of floating-gate memory cells, wherein the array comprises:
    a plurality of rows of memory cells, each row coupled to a word line;
    a plurality of columns of memory cells, each column coupled to a bit line, the memory cells of each column connected in series between a source select gate and a drain select gate;
    for each of the columns of memory cells, a drain contact comprising a head connected substantially perpendicularly to a stem, the head aligned with the drain select gate and overlying a dielectric layer formed on the drain select gate, the stem overlying a polysilicon plug formed on a substrate of the memory device adjacent the drain select gate; and
    for each of the columns of memory cells, a bit line contact coupled to the bit line for that column and in direct electrical contact with the head and aligned with the drain select gate.

18. The electronic system of claim 17, wherein the bit line contact comprises a barrier layer disposed on the drain contact, a first metal layer disposed on the barrier layer, and a second metal layer disposed on the first metal layer.

19. The N electronic system of claim 18, wherein the barrier layer, first metal layer, and second metal layer are respectively of titanium nitride, titanium, and tungsten.

20. The electronic system of claim 17, wherein the drain contact further comprises a barrier layer disposed on the polysilicon plug, a first metal layer disposed on the barrier layer, and a second metal layer disposed on the first metal layer.

21. The electronic system of claim 20, wherein the barrier layer, first metal layer, and second metal layer are respectively of titanium nitride, titanium, and tungsten.

22. A NAND memory array comprising:
a substrate;
a source select gate formed on the substrate;
a drain select gate formed on the substrate;
a string of floating-gate memory cells formed on the substrate and connected in series between the source select gate and the drain select gate;
a drain contact comprising a first portion aligned with the drain select gate and a second portion aligned with and contacting a conductive plug formed on the substrate laterally of the drain select gate;
a bit line overlying the drain contact; and a bit line contact coupled to the bit line and in direct electrical contact with the first portion of the drain contact such that the bit line contact is aligned with the drain select gate, the bit line contact interposed between the bit line and the drain contact.

23. The NAND memory array of claim 22, wherein the bit line contact comprises a barrier layer disposed on the drain contact, a first metal layer disposed on the barrier layer, and a second metal layer disposed on the first metal layer.

24. The NAND memory array of claim 22, wherein the first portion of the drain contact overlies and is in contact with a dielectric layer formed on the drain select gate.

25. A NAND memory device comprising:
an array of floating-gate memory cells, wherein the array comprises:
  a plurality of rows of memory cells, each row coupled to a word line;
  a plurality of columns of memory cells grouped in strings, each column coupled to a corresponding bit line, the memory cells of each string of memory cells connected in series between a corresponding source select gate and a corresponding drain select gate;
  for each string of memory cells, a drain contact comprising a head connected substantially perpendicularly to a stem, the head aligned with the corresponding drain select gate, the stem contacting a conductive plug formed on a substrate of the memory device laterally of the corresponding drain select gate; and
  a bit line contact coupled to the corresponding bit line and in direct electrical contact with the head such that the bit line contact is aligned with the corresponding drain select gate;
wherein the bit line contact is interposed between the head of the drain contact and the corresponding bit line.

26. The NAND memory array of claim 25, wherein each bit line contact comprises a barrier layer disposed a corresponding drain contact, a first metal layer disposed on the barrier layer, and a second metal layer disposed on the first metal layer.

27. The NAND memory array of claim 25, wherein the head of each drain contact overlies and is in contact with a dielectric layer formed on the corresponding drain select gate.

28. An electronic system comprising:
a processor;
a NAND memory device coupled to the processor, the memory device comprising:
  a substrate;
  a source select gate formed on the substrate;
  a drain select gate formed on the substrate;
  a string of floating-gate memory cells formed on the substrate and connected in series between the source select gate and the drain select gate;
  a drain contact comprising a first portion aligned with the drain select gate and a second portion aligned with a conductive plug formed on the substrate laterally of the drain select gate; and
  a bit line contact in direct electrical contact with the first portion of the drain contact such that the bit line contact is aligned with the drain select gate.

29. The NAND memory array of claim 28, wherein the bit line contact comprises a barrier layer disposed on the drain contact, a first metal layer disposed on the barrier layer, and a second metal layer disposed on the first metal layer.

30. The NAND memory array of claim 28, wherein the first portion of the drain contact overlies and is in contact with a dielectric layer formed on the drain select gate.

* * * * *